(12) United States Patent
Nurani et al.

(10) Patent No.: US 10,579,769 B2
(45) Date of Patent: Mar. 3, 2020

(54) USING DESIGN PROXIMITY INDEX AND EFFECT-TO-DESIGN PROXIMITY RATIO TO CONTROL SEMICONDUCTOR PROCESSES AND ACHIEVE ENHANCED YIELD

(71) Applicant: Applied Materials, Inc., Santa Clara, CA (US)

(72) Inventors: Raman K. Nurani, Chennai (IN); Anantha R. Sethuraman, Palo Alto, CA (US); Koushik Ragavan, Chennai (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 250 days.

(21) Appl. No.: 15/829,668

(22) Filed: Dec. 1, 2017

(65) Prior Publication Data

US 2019/0171787 A1 Jun. 6, 2019

(51) Int. Cl.
*G06T 7/00* (2017.01)
*G06F 17/50* (2006.01)
*H01L 21/66* (2006.01)

(52) U.S. Cl.
CPC ........ *G06F 17/5081* (2013.01); *G06T 7/0006* (2013.01); *H01L 22/20* (2013.01); *G06T 2207/20076* (2013.01); *G06T 2207/30148* (2013.01); *H01L 22/12* (2013.01)

(58) Field of Classification Search
CPC ..... G06F 17/5081; H01L 22/20; H01L 22/12; G06T 2207/20076; G06T 7/0006; G06T 2207/30148
See application file for complete search history.

(56) References Cited

U.S. PATENT DOCUMENTS

| | | | | |
|---|---|---|---|---|
| 2007/0288219 A1* | 12/2007 | Zafar | ......... | G03F 1/84 703/14 |
| 2013/0271595 A1* | 10/2013 | Hiroi | ......... | G01B 15/00 348/80 |
| 2019/0170812 A1* | 6/2019 | Nurani | ......... | G01R 31/2862 |

OTHER PUBLICATIONS

U.S. Appl. No. 15/486,089, filed Apr. 12, 2017.
U.S. Appl. No. 62/514,543, filed Jun. 2, 2017.

* cited by examiner

*Primary Examiner* — Yon J Couso
(74) *Attorney, Agent, or Firm* — Patterson + Sheridan LLP

(57) ABSTRACT

A method for detecting a design-impacting defect in an integrated circuit substrate is disclosed. In one implementation, a controller determines a distribution of intended geometric features in a design window of the integrated circuit substrate based on proximities of a plurality of points of interest in the design window to the intended geometric features. The controller obtains a set of intended contours from the distribution. The controller obtains a set of imaged contours from one or more images of the integrated circuit substrate. The controller compares the set of imaged contours to the set of intended contours to obtain a set of potential design-impacting defects in the intended geometric features. The controller determines a probability that a potential design-impacting defect from the set of potential design-impacting defects is a valid design-impacting defect. The controller takes a corrective action based on the determined probability.

19 Claims, 8 Drawing Sheets

USING DESIGN PROXIMITY INDEX AND EFFECT-TO-DESIGN PROXIMITY RATIO TO CONTROL SEMICONDUCTOR PROCESSES AND ACHIEVE ENHANCED YIELD

BACKGROUND

Field

Implementations described herein generally relate to detecting a design-impacting defect in an integrated circuit substrate.

Description of the Related Art

Manufacturing silicon substrates involves a series of steps, which may include lithography, etching, deposition, and planarization, each of which may be repeated for a plurality of layers. Lithographic apparatuses may employ a mask that may contain a circuit pattern corresponding to an individual layer of an integrated circuit, and this pattern can be imaged onto a target portion (e.g. comprising one or more dies) on a substrate (silicon substrate) that has been coated with a layer of radiation-sensitive material (resist). In general, a single substrate will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a substrate stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an integrated circuit. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate. These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures.

As semiconductor manufacturing processes continue to advance, the dimensions of circuit elements have continually been reduced while the amount of functional elements, such as transistors, per device has been steadily increasing over decades, following a trend commonly referred to as 'Moore's law'. In such circumstances, a stray particle that falls on a circuit element on a layer of the substrate during a lithographic or etch process may cause a process impacting defect, such as an open circuit or a short circuit.

Generally, integrated circuit substrates are inspected (e.g., by metrology tools) after the manufacturing process is complete in order to identify defects and determine the overall quality of the substrates. Due to the large numbers of substrates which may manufactured (e.g., hundreds of thousands in a month), waiting to make quality determinations until each substrate can be individually inspected after the fact is not always efficient or feasible. Furthermore, basing determinations on inspection of only a small representative subset of substrates may result in inaccurate determinations.

Therefore, there is a need in the art for improved techniques of determining the quality of substrates which result from manufacturing processes.

SUMMARY

Nom Implementations described herein generally relate to detecting a design-impacting defect in an integrated circuit substrate. In one embodiment, a method includes determining a distribution of intended geometric features in a design window of the integrated circuit substrate based on proximities of a plurality of points of interest in the design window to the intended geometric features. The method further includes obtaining a set of intended contours from the distribution. The method further includes obtaining a set of imaged contours from one or more images of the integrated circuit substrate. The method further includes comparing the set of imaged contours to the set of intended contours to obtain a set of potential design-impacting defects in the intended geometric features. The method further includes determining a probability that a potential design-impacting defect from the set of potential design-impacting defects is a valid design-impacting defect. The method further includes taking a corrective action based on the determined probability.

In another implementation, a computer system is provided, which comprises a memory and a processor configured to perform a method for detecting a design-impacting defect in an integrated circuit substrate. In one embodiment, the method includes determining a distribution of intended geometric features in a design window of the integrated circuit substrate based on proximities of a plurality of points of interest in the design window to the intended geometric features. The method further includes obtaining a set of intended contours from the distribution. The method further includes obtaining a set of imaged contours from one or more images of the integrated circuit substrate. The method further includes comparing the set of imaged contours to the set of intended contours to obtain a set of potential design-impacting defects in the intended geometric features. The method further includes determining a probability that a potential design-impacting defect from the set of potential design-impacting defects is a valid design-impacting defect.

The method further includes taking a corrective action based on the determined probability.

In yet another implementation, a non-transitory computer-readable medium is provided, which comprises instructions to perform a method for detecting a design-impacting defect in an integrated circuit substrate. In one embodiment, the method includes determining a distribution of intended geometric features in a design window of the integrated circuit substrate based on proximities of a plurality of points of interest in the design window to the intended geometric features. The method further includes obtaining a set of intended contours from the distribution. The method further includes obtaining a set of imaged contours from one or more images of the integrated circuit substrate. The method further includes comparing the set of imaged contours to the set of intended contours to obtain a set of potential design-impacting defects in the intended geometric features. The method further includes determining a probability that a potential design-impacting defect from the set of potential design-impacting defects is a valid design-impacting defect. The method further includes taking a corrective action based on the determined probability.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
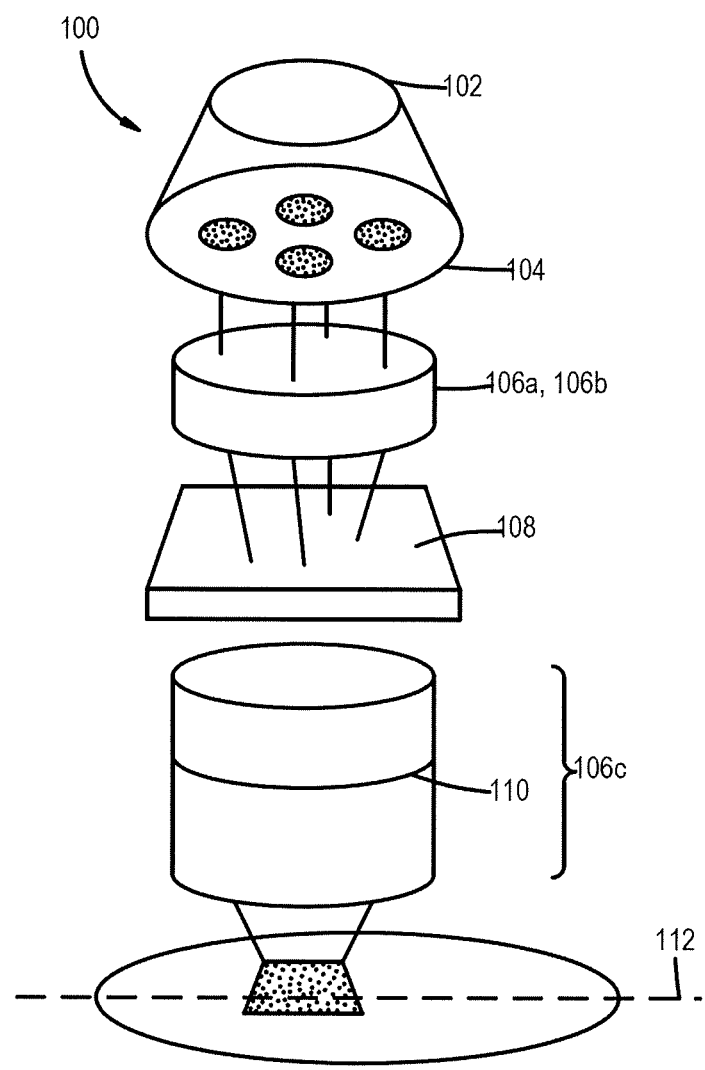
FIG. 1 illustrates an exemplary lithographic projection system.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes a method for detecting a design-impacting defect in an integrated circuit substrate. Certain details are set forth in the following description and in FIGS. 1-7 to provide a thorough understanding of various implementations of the disclosure. Other details describing well-known structures and systems often associated with plasma etching are not set forth in the following disclosure to avoid unnecessarily obscuring the description of the various implementations.

Many of the details, dimensions, components, and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

In semiconductor fabrication, each step must be performed with a sufficient level of precision so that the resulting product works correctly. Certain defects which occur during the lithography, etching, deposition, or planarization steps may require significant corrective actions in order to rework the substrate. Correcting these defects may result in substantial increases in time and cost. Not all defects are substantial enough to require correction. For example, the presence of a dust particle on the substrate may cause an open circuit in a design feature or a short circuit between design features. Therefore, there is a need for a more intelligent way to address defects which occur during the manufacturing process.

Embodiments of the present disclosure involve detecting a design-impacting defect in an integrated circuit substrate. In one implementation, a controller determines a distribution of intended geometric features in a design window of the integrated circuit substrate based on proximities of a plurality of points of interest in the design window to the intended geometric features. The controller obtains a set of intended contours from the distribution. The controller obtains a set of imaged contours from one or more images of the integrated circuit substrate. The controller compares the set of imaged contours to the set of intended contours to obtain a set of potential design-impacting defects in the intended geometric features. The controller determines a probability that a potential design-impacting defect from the set of potential design-impacting defects is a valid design-impacting defect. The controller takes a corrective action based on the determined probability.

In one example, the controller instructs, based on the probability, a manufacturing system to take corrective action to reduce or eliminate the likelihood of the open or short. In another example, predictive information may be provided so that the predictive information can be analyzed by engineers and so that corrective action may be taken as needed regarding problems which are identified. The controller may also determine appropriate corrective action to be taken based on analysis of the data (e.g., based on identifying correlations between tool parameters and substrate parameters throughout the process, and sensor time traces), and provide instructions to perform corrective action. In some embodiments, the controller may automatically take corrective action (e.g., recalibrating or adjusting a parameter of a lithography tool, redoing a portion of the manufacturing process for a substrate, and the like) based on the predictive information. In certain embodiments, if the predictive information identifies a problem with one or more parameters of a substrate, the problem may be verified by analyzing the substrate (e.g., using metrology tools). If the problem is confirmed by analyzing the substrate, corrective action may then be taken (e.g., manually or automatically by the controller).

Embodiments of the present disclosure may allow for efficient and accurate predictions about substrate quality and yield impacted by a defect occurring in a design window of the substrate. Furthermore, embodiments may allow for effective determinations to be made regarding improvements with respect to such processes as thin film deposition, etching, and implant processes in order to achieve predictable process windows and optimal thin film properties.

FIG. 1 illustrates an exemplary lithographic projection system 100. The major components are a light source 102, which may be, for example, a deep-ultraviolet excimer laser source, or a source of other wavelengths, including EUV wavelength, illumination optics, which define the partial coherence, and which may include specific source shaping optics 104, 106a and 106b; a mask or reticle 108; and projection optics 106c that produce an image of the reticle pattern onto the substrate plane 112. An adjustable filter or aperture at the pupil plane may restrict the range of beam angles that impinge on the substrate plane 112, where the largest possible angle defines the numerical aperture of the projection optics.

Figure 2:
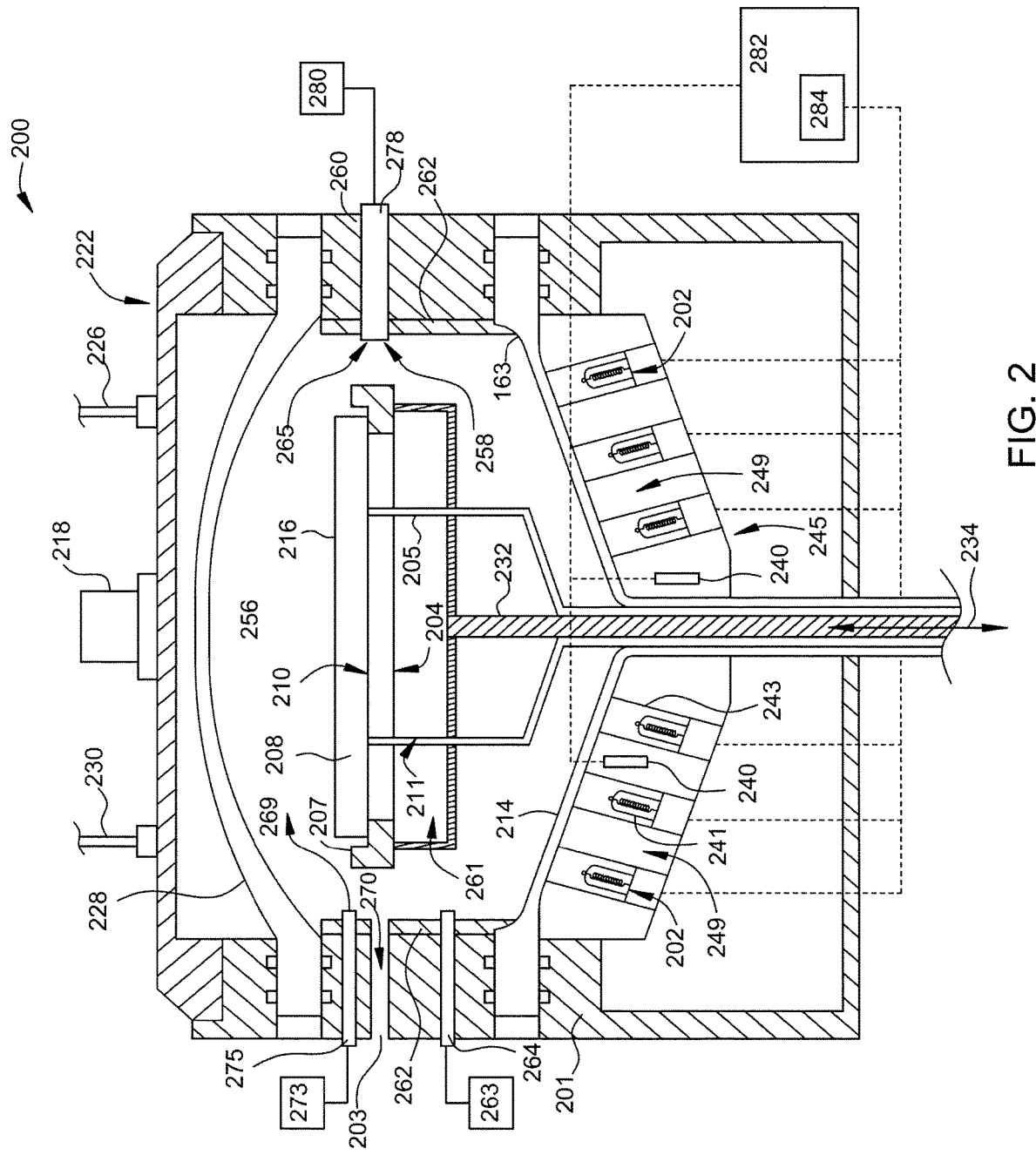
FIG. 2 is a schematic, cross-sectional view of a plasma processing system according to one embodiment of the present invention.

FIG. 2 is a schematic, cross-sectional view of a plasma processing system 200 according to one embodiment of the present invention. The plasma processing system 200 may be a plasma etch chamber, a plasma enhanced chemical vapor deposition chamber, a physical vapor deposition chamber, a plasma treatment chamber, an ion implantation chamber, or other suitable vacuum processing chamber. As shown in FIG. 2, the plasma processing system 200 generally includes a chamber lid assembly 210, a chamber body assembly 240, and an exhaust assembly 290, which collectively enclose a processing region 202 and an evacuation region 204. In practice, processing gases are introduced into the processing region 202 and ignited into a plasma using RF power. A substrate 205 is positioned on a substrate support assembly 260 and exposed to the plasma generated in the processing region 202 to perform a plasma process on the substrate 205, such as etching, chemical vapor deposition, physical vapor deposition, implantation, plasma annealing, plasma treating, abatement, or other plasma processes. Vacuum is maintained in the processing region 202 by the exhaust assembly 290, which removes spent processing gases and byproducts from the plasma process through the evacuation region 204.

The chamber lid assembly 210 generally includes an upper electrode 212 (or anode) isolated from and supported by the chamber body assembly 240 and a chamber lid 214 enclosing the upper electrode 212. The upper electrode 212 is coupled to an RF power source 203 via a conductive gas inlet tube 226. The conductive gas inlet tube 226 is coaxial with a central axis (CA) of the chamber body assembly 240 so that both RF power and processing gases are symmetrically provided. The upper electrode 212 includes a showerhead plate 216 attached to a heat transfer plate 218.

The showerhead plate 216 has a central manifold 220 and one or more outer manifolds 222. The one or more outer manifolds 222 circumscribe the central manifold 220. The central manifold 220 receives processing gases from a gas source 206 through the gas inlet tube 226 and distributes the received processing gases into a central portion of the processing region 202 through a plurality of gas passages 221. The outer manifold(s) 222 receives processing gases, which may be the same or a different mixture of gases received in the central manifold 220, from the gas source 206. The outer manifold(s) 222 then distributes the received processing gases into an outer portion of the processing region 202 through a plurality of gas passages 223.

A heat transfer fluid is delivered from a fluid source 209 to the heat transfer plate 218 through a fluid inlet tube 230. The fluid is circulated through one or more fluid channels 219 disposed in the heat transfer plate 218 and returned to the fluid source 209 via a fluid outlet tube 231.

The chamber body assembly 240 includes a chamber body 242 fabricated from a conductive material resistant to processing environments, such as aluminum or stainless steel. The exhaust assembly 290 is disposed below the chamber body 242 and has evacuation passages 288 positioned symmetrically about the central axis (CA). The evacuation passages 288 allow evacuation of gases from the processing region 202 through the evacuation region 204 and out of the chamber body 242 through an exhaust port 296. Evacuation liner 287 may protect the chamber body 242 from processing gases during evacuation. The evacuation liner 287 may be constructed of materials similar to that of an upper liner assembly 244 as described below.

The substrate support assembly 260 is disposed centrally within a central region 256 of the chamber body assembly 240 wherein the central axis (CA) passes vertically through the center of the substrate support assembly 260. The substrate support assembly 260 generally includes substrate support 261 (or cathode) and a hollow pedestal 262 and is supported by a central support member 257. The substrate support 261 is coupled to the RF power source 203 through a matching network (not shown) and a cable (not shown) routed through the hollow pedestal 262. When RF power is supplied to the upper electrode 212 and the substrate support 261, an electrical field formed therebetween ignites the processing gases present in the processing region 202 into the plasma. In one embodiment, the substrate support 261 is an electrostatic chuck, and thus includes one or more electrodes (not shown) disposed therein. A voltage source (not shown) biases the one or more electrodes with respect to the substrate 105 to create an attraction force to hold the substrate 205 in position during processing.

An actuation assembly 263 is attached to the chamber body 242 and/or the central support member 257. The actuation assembly 263 includes an actuator 264 (e.g., motor), which, in turn raises or lowers the pedestal 262 to provides vertical movement of the substrate support 261 relative to the upper electrode 212. A plasma screen 259 is also provided, supported by the substrate support 261 and overlaps the upper liner assembly 244, to protect the substrate support assembly 160 from the plasma in the processing region 202.

The substrate support assembly 260 further includes a lift pin assembly 267 to facilitate loading and unloading of the substrate 205. The lift pin assembly 267 includes lift pins 268 which extend through lift pin holes 271 disposed in the substrate support 261. The lift pin 268 is coupled to an actuator 295 (e.g., motor) which advances or retracts the lift pins 268.

The substrate support assembly 260 may also include a gas port 276 disposed therethrough and coupled to an inert gas supply 277 via a gas supply line 278. The gas supply 277 supplies an inert gas, such as helium, through the gas supply line 278 and the gas port 276 to the backside of the substrate 205 in order to help prevent processing gases from processing the backside of the substrate 205.

The substrate support assembly 260 may further include one or more fluid inlet lines 279 and fluid outlet lines 281 routed from a heat exchange fluid source 298 to through one or more heat exchange channels (not shown) in the substrate support 261 in order to provide temperature control to the substrate support 261 during processing.

The upper liner assembly 244 is disposed within an upper portion of the chamber body 242 circumscribing the processing region 202. The upper liner assembly 244 may be constructed from a conductive, process compatible material, such as aluminum, stainless steel, and/or yttria (e.g., yttria coated aluminum). In practice, the upper liner assembly 144 shields the upper portion of the chamber body 242 from the plasma in the processing region 202 and is removable to allow periodic cleaning and maintenance.

The chamber body 242 includes a ledge 243 that supports an outer flange 245 of the upper liner assembly 244. An inner flange 246 of the upper liner assembly 244 supports the upper electrode 212. An insulator 213 is positioned between the upper liner assembly 244 and the upper electrode 212 to provide electrical insulation between the chamber body assembly 240 and the upper electrode 212.

The upper liner assembly 244 includes an outer wall 247 attached to the inner and outer flanges (246, 245), a bottom wall 248, and an inner wall 249. The outer wall 247 and inner wall 249 are substantially vertical, cylindrical walls. The outer wall 247 is positioned to shield the chamber body 242 from plasma in the processing region 202, and the inner wall 249 is positioned to at least partially shield the side of the substrate support assembly 260 from plasma in the processing region 202. The bottom wall 248 joins the inner and outer walls (249, 247).

The processing region 202 is accessed through a substrate passage opening 241 disposed in the chamber body 242 that allows entry and removal of the substrate 205 into/from the substrate support assembly 260. The upper liner assembly 244 has an opening 250 disposed therethrough that matches the substrate passage opening 241 to allow passage of the substrate 205 therethrough. The chamber body assembly 240 includes a slit valve door assembly 151. The slit valve door assembly 251 is disposed in a cavity 270 defined between the outer wall 247 and the chamber body 242. The slit valve door assembly 251 includes an actuator 252 and a split slit liner door 253. The actuator 252 is coupled to the split slit liner door 253 and is configured to vertically raise and retract the split slit liner door 253 within the cavity 270, between positions blocking and allowing access through the substrate passage opening 241 and opening 250. The split slit liner door 253 is configured to engage a backside 215 of the outer wall 247 for sealing the opening 250.

Embodiments of the present disclosure are not limited to plasma or vacuum-based chambers, but are equally applicable to chemical vapor deposition chambers.

Figure 3:
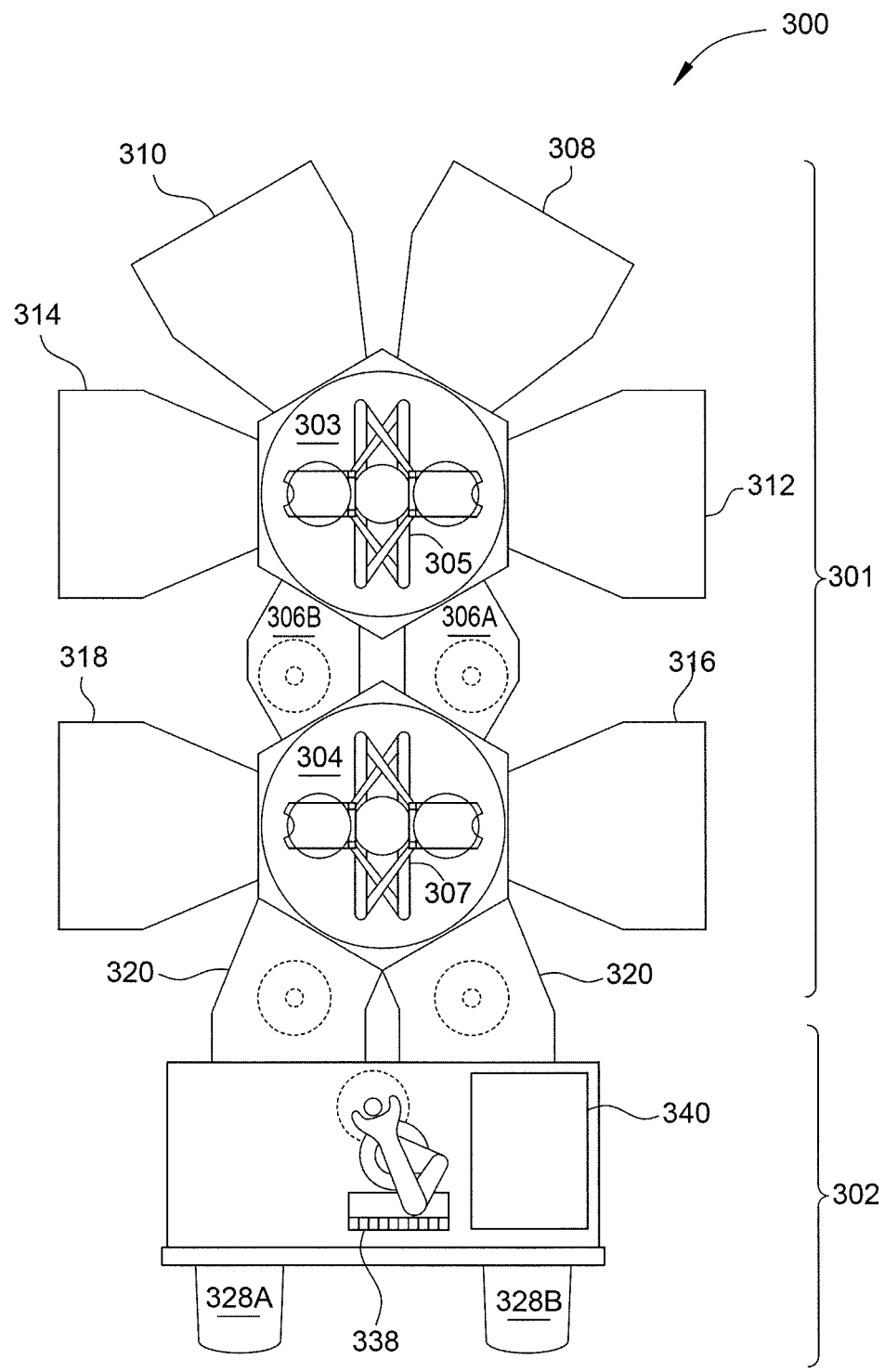
FIG. 3 schematically illustrates one or more manufacturing tools for substrate processing, in accordance with one embodiment of the present disclosure.

FIG. 3 schematically illustrates one or more manufacturing tools 301 for substrate processing, in accordance with one embodiment of the present disclosure. It is contemplated that the method described herein may be practiced in other tools configured to perform a process sequence. For example, the manufacturing tools 301 embodied in FIG. 3 may be the ENDURA® cluster tool commercially available from Applied Materials, Inc. in Santa Clara, Calif., or other suitable tool.

The manufacturing tools 301 include a vacuum-tight set of manufacturing tools 301 and a factory interface 302. The manufacturing tools 301 comprises a plurality of processing chambers 310, 308, 314, 312, 318, 316, such as the processing system 200 described in FIG. 2, and at least one load-lock chamber 320, which are coupled to vacuum substrate transfer chambers 303, 304. The factory interface 302 is coupled to transfer chamber 304 by the load lock chamber 320.

In one embodiment, the factory interface 302 comprises at least one docking station, at least one substrate transfer robot 338, and at least one substrate aligner 340. The docking station is configured to accept one or more front opening unified pods 328 (FOUP). Two FOUPs 328A, 328B are shown in the embodiment of FIG. 3. The substrate transfer robot 338 is configured to transfer the substrate from the factory interface 302 to the load lock chamber 320.

The load lock chamber 320 has a first port coupled to the factory interface 302 and a second port coupled to a first transfer chamber 304. The load lock chamber 320 is coupled to a pressure control system which pumps down and vents the chamber 320 as needed to facilitate passing the substrate between the vacuum environment of the transfer chamber 304 and the substantially ambient (e.g., atmospheric) environment of the factory interface 302.

The first transfer chamber 304 and the second transfer chamber 303 respectively have a first robot 307 and a second robot 305 disposed therein. Two substrate transfer platforms 306A, 306B are disposed in the transfer chamber 304 to facilitate transfer of the substrate between robots 305, 307. The platforms, 306B can either be open to the transfer chambers 303, 304 or be selectively isolated (i.e., sealed) from the transfer chambers 303, 304 to allow different operational pressures to be maintained in each of the transfer chambers 303, 304.

The robot 307 disposed in the first transfer chamber 304 is capable of transferring substrates between the load lock chamber 320, the processing chambers 316, 318, and the substrate transfer platforms 306A, 3206B. The robot 305 disposed in the second transfer chamber 303 is capable of transferring substrates between the substrate transfer platforms 306A, 306B and the processing chambers 312, 314, 310, 308.

Figure 4:
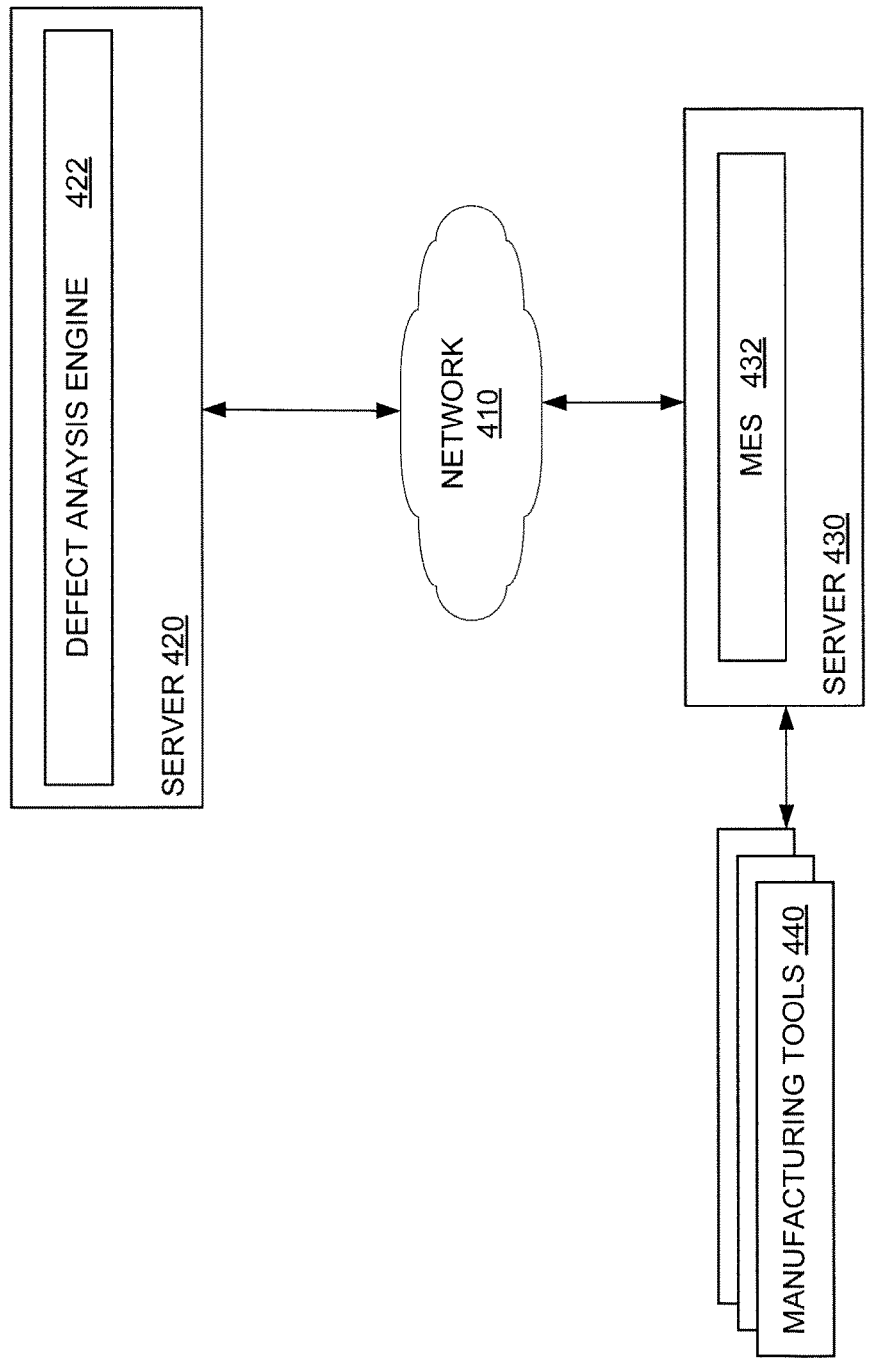
FIG. 4 depicts a network environment in which embodiments of the present disclosure may be implemented.

FIG. 4 depicts a network environment 400 in which embodiments of the present disclosure may be implemented. As shown, network environment 400 includes a server 420 which is connected via network 410 to another server 430 which is connected to one or more manufacturing tools 440. Network 410 may, for example, comprise the Internet. In another embodiment, manufacturing tools 440 are also connected directly to server 420.

The defect analysis engine 422 identifies data sources that define a system and/or that are used to monitor a system, such as the collection of manufacturing tools 440 corresponding to manufacturing tools 301. The manufacturing tools 440 may be semiconductor processing equipment, such as one or more of a chamber for an etch reactor, a deposition chamber, and so on, corresponding to the platform 306 comprises the plurality of processing chambers 310, 308, 314, 312, 318, 316, of FIG. 3, such as the processing system 200 described in FIG. 2 and the lithographic projection system 100 of FIG. 1.

Server 420 may comprise a computing device such as a rack server, desktop or laptop computer, mobile phone, tablet, or other suitable computing device. As shown, server 420 comprises a defect analysis engine 422 which may perform operations described herein related to making determinations and predictions regarding probabilities of design-impacting defects occurring in an integrated circuit silicon substrate. For example, defect analysis engine 422 may analyze information received from MES 432 (e.g., chip design data, defect data, information about the manufacturing process, information about the manufacturing tools, and metrology data) in order to identify excursions (e.g., outliers in the data pertaining to intended geometric features that may be defects) and make predictions about defects. In some embodiments, the server 420 is separate from the manufacturing tools 440. In other embodiments, the server may be part of the manufacturing tools 440 or may be an off-line server.

For example defect analysis engine 422 may receive information from MES 432 about a defect of a certain diameter (e.g., a foreign particle of a certain diameter), and may calculate the probability of a yield impact resulting from the defect occurring within design features of a selected design window of the substrate. This calculation may involve determining the probability of the defect occurring in a critical area in the design window of a substrate (e.g., an area where the defect may cause a problem), and then determining the probability of an open or a short occurring as a result of the defect occurring in the design window. Furthermore, defect analysis engine 422 may apply filtering, grouping, and analysis algorithms to determine a distribution of intended geometric features in a design window of the integrated circuit substrate based on proximities of a plurality of points of interest in the design window to the intended geometric features. Determining the distribution determines requires determining a design proximity index assigned to each of the points in the design window. The design proximity index is a measure of how close a point of interest is to a nearby design feature. The distance may be a Euclidian distance between the points of interest and the design feature. The design proximity index is obtained by geometrically determining the distribution of these measures for the given design window.

The defect analysis engine 422 may obtain a set of intended contours from the distribution. The defect analysis engine 422 may obtain a set of imaged contours from one or more images of the integrated circuit substrate. The defect analysis engine 422 may compare the set of imaged contours to the set of intended contours to obtain a set of potential design-impacting defects in the intended geometric features. The defect analysis engine 422 may determine a probability that a potential design-impacting defect from the set of potential design-impacting defects is a valid design-impacting defect. For a given potential defect, its attributes such as shape and size are used to determine the probability that this defect will cause an open or short failure in that design window. This probability denotes the defect-to-design proximity ratio.

Correlations between design-to-defect proximity ratio and tool parameters may be used to determine corrective actions to be taken, such as changes to be made to the tool parameters, in order to improve the manufacturing process. Furthermore, predictive information about yield impacts may be useful from a cost and planning perspective. Probabilities and predictive information may be determined using, for example, fundamental statistical processes or stochastic-based analyses such as multilayer regression, components of variation, Markov calculations, hidden Markov calculations, Kolmogorov-Smirnov calculations, or the like. Defect analysis engine 422 may provide predictive information to MES 432.

Defect analysis engine 422 may also make determinations about particular defects based on all of information received from MES 432. For example, defect analysis engine 422 may determine whether a particular defect requires corrective action to be taken. Defect analysis engine 422 may analyze the defect in view of all of the information it has received (e.g., alignment data, chip design data, defect data, information about the manufacturing process, information about the manufacturing tools, and metrology data) in order to determine whether the defect is of a substantial enough size to cause a problem, and then return instructions to MES 432 regarding whether or not to take corrective action.

Server 430 may comprise a computing device such as a rack server, desktop or laptop computer, mobile phone, tablet, or other suitable computing device. As shown, server 420 comprises an MES 432, which may perform operations described herein related to detecting a design-impacting defect in an integrated circuit substrate. For example, MES 432 may coordinate processes performed by the plurality of manufacturing tools 440, and may collect data from these tools (e.g., alignment data, chip design data, defect data, information about the manufacturing process, information about the parameters of manufacturing tools 440, and metrology data). MES 432 may provide this information to defect analysis engine 422 (e.g., over network 410), which may analyze the information and provide predictive information to defect analysis engine 422 in return. In some embodiments defect analysis engine 422 may provide instructions to MES 432 regarding corrective action to take with respect to an individual defect, a manufacturing tool 440, or other aspects of the manufacturing process. In certain embodiments, MES 432 automatically takes corrective action, such as by instructing individual manufacturing tools 440 to perform certain tasks (e.g., instructing a lithography tool to strip and recoat a substrate in order to correct an alignment defect or instructing a deposition tool to alter one or more parameters).

Manufacturing tools 440 may comprise one or more tools which perform processes related to manufacturing silicon substrates. For example, manufacturing tools 440 may include lithography tools (e.g., including mechanical and optical alignment tools), etching tools, deposition tools, and planarization tools. Manufacturing tools 440 may communicate with MES 432 in order to receive instructions and provide information about, for example, substrates, defects, parameters, and the manufacturing process.

Figure 5:
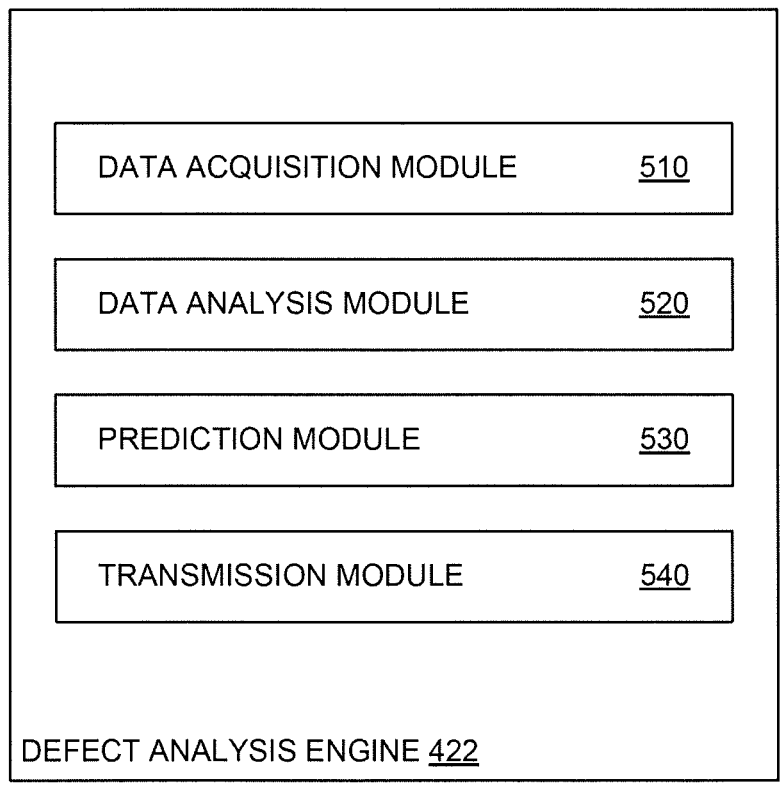
FIG. 5 illustrates components of defect analysis engine according to embodiments of the present disclosure.

FIG. 5 illustrates components of the defect analysis engine 422 according to embodiments of the present disclosure. As shown, the defect analysis engine 422 includes a data acquisition module 510, which may acquire data from MES 432 (e.g., over network 410). Defect analysis engine 422 further includes a data analysis module 520, which may analyze data received from MES 432 in order to identify correlations and determine probabilities of defects occurring in a design window of a substrate and causing opens or shorts. Defect analysis engine 422 further includes a prediction module 530, which may make predictions about yield impacts and other aspects of the manufacturing process based on determinations made by data analysis module 520. Data analysis module 520 and prediction module 530 may, for example, make determinations based on fundamental statistical processes and stochastic-based analyses of data received from MES 432. Defect analysis engine 422 further includes a transmission module 540, which may transmit data such as predictive information and corrective instructions to MES 432 (e.g., over network 410).

It is noted that the components shown in FIG. 5 are merely exemplary, and the operations described herein may be implemented by any combination of local or distributed components.

Figure 6A:
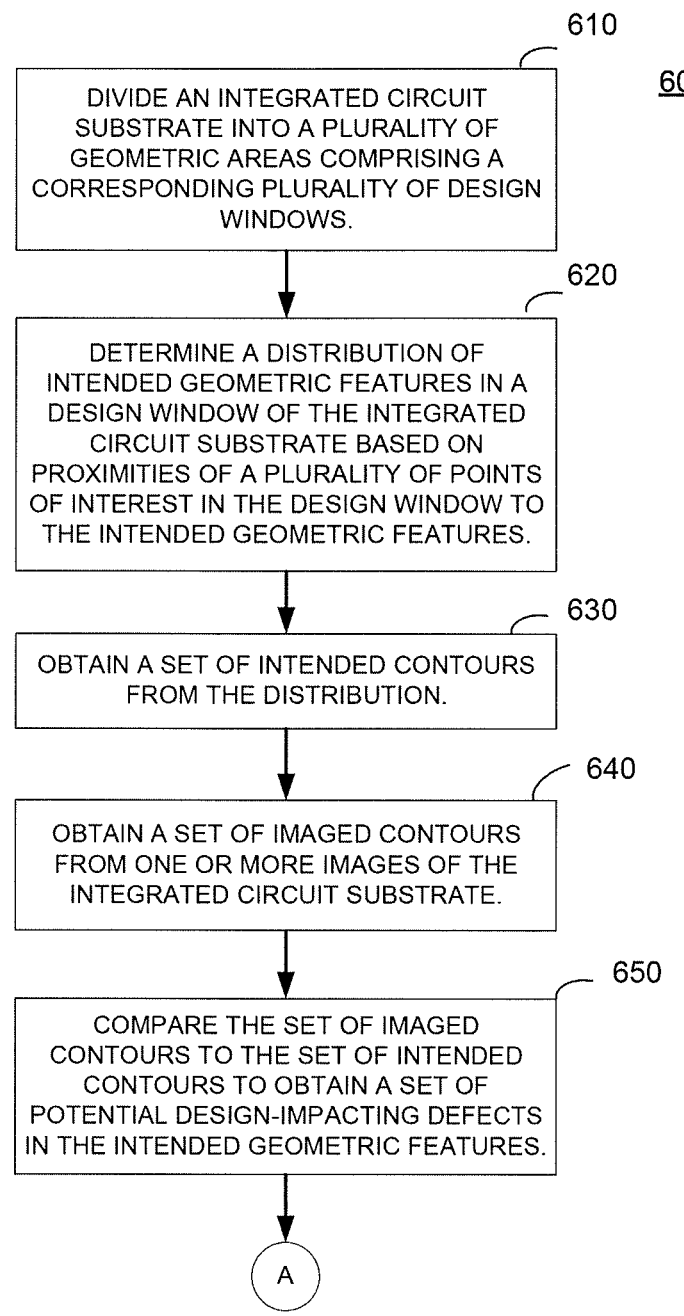
FIGS. 6A and 6B illustrate one embodiment of a method for detecting a design-impacting defect in an integrated circuit substrate.
Figure 6B:
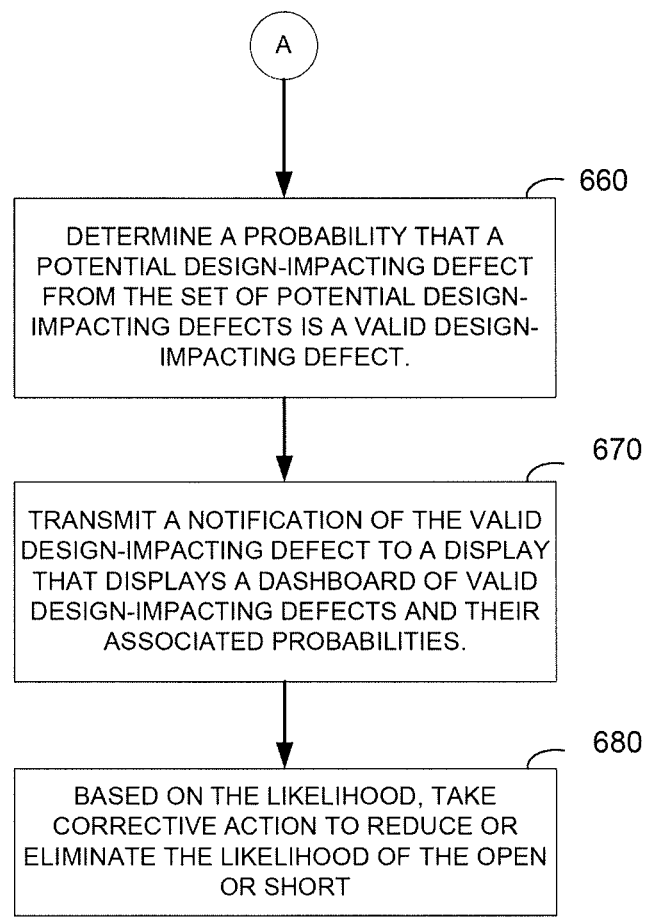

FIGS. 6A and 6B illustrate one embodiment of a method 600 for detecting a design-impacting defect in an integrated circuit substrate. Method 600 can be performed by processing logic that can comprise hardware (e.g., circuitry, dedicated logic, programmable logic, microcode, etc.), software (e.g., instructions run on a processing device), or a combination thereof. In one embodiment, method 600 is performed by the defect analysis engine 422 of FIG. 4.

At block 610, the defect analysis engine 422 divides an integrated circuit substrate into a plurality of geometric areas comprising a corresponding plurality of design windows. At block 620, the defect analysis engine 422 determines a distribution of intended geometric features in a design window of the integrated circuit substrate based on proximities of a plurality of points of interest in the design window to the intended geometric features. The defect analysis engine 422 determining a proximity of a point of interest in the design window to an intended geometric feature may comprise the defect analysis engine 422 determining a Euclidian distance between the point and the intended design feature.

In one embodiment, the defect may be benign in a first layer but may be impacting in a second layer. In one embodiment, the defect is at least one stray particle. In another embodiment, the defect is identified based on a population of stray particles in the design window. The defect analysis engine 422 may calculate a minimum size of the particles in the population of particles that is operable to cause a short or open in the design window.

At block 630, the defect analysis engine 422 obtains a set of intended contours from the distribution. At block 640, the defect analysis engine 422 obtains a set of imaged contours from one or more images of the integrated circuit substrate. At block 650, the defect analysis engine 422 compares the set of imaged contours to the set of intended contours to obtain a set of potential design-impacting defects in the intended geometric features.

At block 660, the defect analysis engine 422 determines a probability that a potential design-impacting defect from the set of potential design-impacting defects is a valid design-impacting defect. Based on the probability, the defect analysis engine 422 determines the likelihood of an open or a short occurring as a result of the defect occurring in the design window. The likelihood may be determined based on fundamental statistical processes or stochastic-based analyses of all of the data received from MES 432.

A potential design-impacting defect may be an open circuit in a design feature or a short circuit between design features. The defect analysis engine 422 determining that the probability of the potential design-impacting defect is a valid design-impacting defect may comprise defect analysis engine 422 predicting that the potential design impacting defect exceeds a predetermined size. The defect analysis engine 422 determining that the probability of the potential design-impacting defect is a valid design-impacting defect may comprise defect analysis engine 422 predicting that the potential design impacting defect has a predetermined shape. The defect analysis engine 422 may determine the probability using at least one of stochastic-based analysis, CAA (Critical Area Analysis) analysis, and hidden Markov analysis. In one example, the defect analysis engine 422 may use probability calculations based on the information received from MES 432 in order to determine the probability of this particular defect occurring in the design window of a given layer of a substrate. The probability of the potential design-impacting defect is a valid design-impacting defect may be used as a metric for predicting one or more design excursions.

At block 670, the defect analysis engine 422 may transmit a notification of the valid design-impacting defect to a display that displays a dashboard of valid design-impacting defects and their associated probabilities. The defect analysis engine 422 may rank order valid design-impacting defects and present the rank ordering on the dashboard. The defect analysis engine 422 may receive a selection of one of the rank ordered valid design-impacting defects to take a corrective action.

At block 680, the defect analysis engine 422 instructs, based on the likelihood, the MES 432 to take corrective action to reduce or eliminate the likelihood of the open or short. In some embodiments, MES 432 automatically takes corrective action based on the size of the defect. In other embodiments, engineers and strategists may analyze the predicted size of the defect in order to identify ways to improve the manufacturing process.

The instructions may include providing a prediction regarding a yield impact. The corrective action may comprise at least one of: correcting an alignment of a substrate, and altering a parameter of a manufacturing tool. The corrective action may include, for example, adjusting an overlay mark to the correct location, stripping and recoating the substrate, making an adjustment to a tool parameter, or the like.

In one example, the defect analysis engine 422 provides predictive information to the MES 432 based on the probability determined at 660. The predictive information may identify the probability of a yield impact based on the above calculations, and may identify additional information about the numbers and types of defects likely to occur in a given set of substrates.

Figure 7:
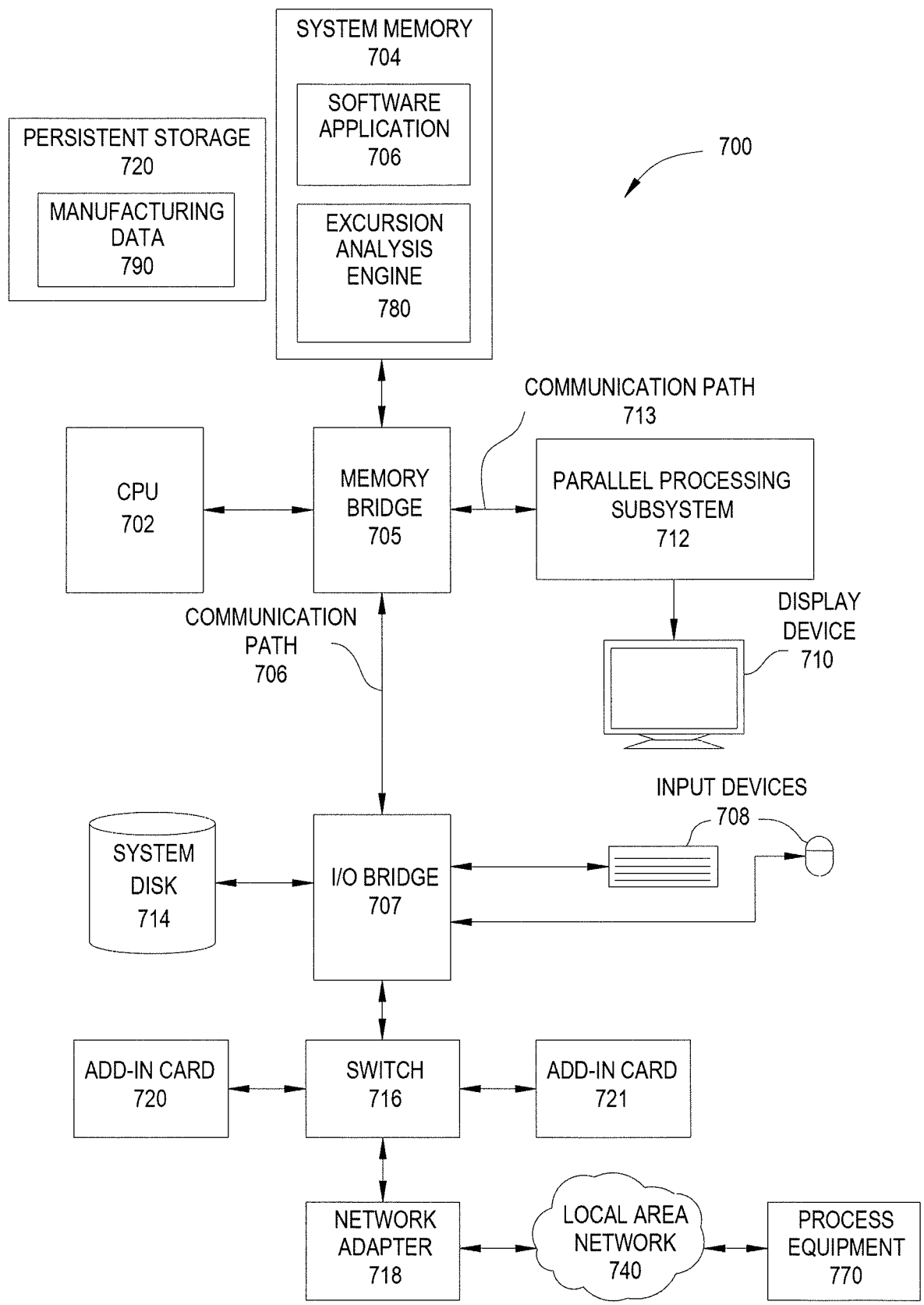
FIG. 7 depicts an example computer system with which embodiments of the present disclosure may be implemented.

FIG. 7 illustrates an example computing system 700 used to detect and analyze excursions, according to some embodiments of the present disclosure. In certain embodiments, computer system 700 is representative of the server 420. Aspects of computer system 700 may also be representative of other devices used to perform techniques described herein (e.g., server 430). For example, computing system 700 may be a personal computer, industrial processor, personal digital assistant, mobile phone, mobile device or any other device suitable for practicing one or more embodiments of the present invention.

The system 700 includes a central processing unit (CPU) 702 and a system memory 704 communicating via a bus path that may include a memory bridge 705. CPU 702 includes one or more processing cores, and, in operation, CPU 702 is the master processor of the system 700, controlling and coordinating operations of other system components. System memory 704 stores a software application 706, and data, for use by CPU 702. CPU 702 runs software applications and optionally an operating system.

Illustratively, the system memory 704 includes the excursion analysis system 780, which may correspond to the defect analysis engine 422, which performs operations related to detecting sensor excursions, according to techniques described herein. For example, the excursion analysis engine 780 may be equivalent to the defect analysis engine 422 in FIG. 4, and may use fundamental statistical processes and stochastic-based analyses of data captured during substrate manufacturing to detect and verify sensor excursions and other aspects of the manufacturing process.

Memory bridge 705, which may be, e.g., a Northbridge chip, is connected via a bus or other communication path (e.g., a HyperTransport link) to an I/O (input/output) bridge 707. I/O bridge 707, which may be, e.g., a Southbridge chip, receives user input from one or more user input devices 708 (e.g., keyboard, mouse, joystick, digitizer tablets, touch pads, touch screens, still or video cameras, motion sensors, and/or microphones) and forwards the input to CPU 702 via memory bridge 805.

A display processor 712 is coupled to the memory bridge 705 via a bus or other communication path (e.g., a PCI Express, Accelerated Graphics Port, or HyperTransport link); in one embodiment display processor 712 is a graphics subsystem that includes at least one graphics processing unit (GPU) and graphics memory. Graphics memory includes a display memory (e.g., a frame buffer) used for storing pixel data for each pixel of an output image. Graphics memory can be integrated in the same device as the GPU, connected as a separate device with the GPU, and/or implemented within system memory 704.

Display processor 712 periodically delivers pixels of the dashboard to a display device 710 (e.g., a screen or conventional CRT, plasma, OLED, SED or LCD based monitor or television). Additionally, display processor 712 may output pixels to film recorders adapted to reproduce computer generated images on photographic film. Display processor 712 can provide display device 710 with an analog or digital signal.

Persistent storage 720 is also connected to I/O bridge 707 and may be configured to store content and applications and data, such as a database library 715, for use by CPU 702 and display processor 712. Persistent storage 720 provides nonvolatile storage for applications and data and may include fixed or removable hard disk drives, flash memory devices, and CD-ROM, DVD-ROM, Blu-ray, HD-DVD, or other magnetic, optical, or solid state storage devices.

Illustratively, persistent storage 720 includes manufacturing data 790, which may comprise information acquired by the defect analysis engine 422. Manufacturing data 790 may, for example, comprise information received from MES 432, collected by the manufacturing tools 440, related to various sensors taking measurements from substrates and tools over time during the manufacturing processes.

A switch 716 provides connections between the I/O bridge 707 and other components such as a network adapter 718 and various add-in cards 720 and 721. Network adapter 718 allows the system 700 to communicate with other systems via an electronic communications network, and may include wired or wireless communication over local area networks 740 and wide area networks such as the Internet.

Other components (not shown), including USB or other port connections, film recording devices, or other suitable computing device, may also be connected to I/O bridge 707. For example, process equipment 770 may operate from instructions and/or data provided by CPU 702, system memory 704, or persistent storage 720. Communication paths interconnecting the various components in FIG. 7 may be implemented using any suitable protocols, such as PCI (Peripheral Component Interconnect), PCI Express (PCI-E), AGP (Accelerated Graphics Port), HyperTransport, or any other bus or point-to-point communication protocol(s), and connections between different devices may use different protocols, as is known in the art.

The process equipment 770 may be one or more semiconductor chambers such as a plasma enhanced chemical vapor deposition (PECVD) or other plasma processing tool, such as the processing tools contained in the manufacturing tools 440. For example, process equipment 770 may be an etch chamber, a chemical vapor deposition chamber, a physical vapor deposition chamber, an implant chamber, a plasma treatment chamber, or other plasma processing chamber, either alone or in combination with one or more other chambers, such as processing system 200.

In one embodiment, display processor 712 incorporates circuitry optimized for performing mathematical operations, including, for example, math co-processor, and may additionally constitute a graphics processing unit (GPU). In another embodiment, display processor 712 incorporates circuitry optimized for general purpose processing. In yet another embodiment, display processor 712 may be integrated with one or more other system elements, such as the memory bridge 705, CPU 802, and I/O bridge 707 to form a system on chip (SoC). In still further embodiments, display processor 712 is omitted and software executed by CPU 702 performs the functions of display processor 712.

Pixel data can be provided to display processor 712 directly from CPU 702. In some embodiments, instructions and/or data representing an excursion verification analysis is provided to set of server computers, each similar to the system 700, via network adapter 718 or system disk 714. The servers may perform operations on subsets of the data using the provided instructions for analysis. The results from these operations may be stored on computer-readable media in a digital format and optionally returned to the system 700 for further analysis or display. Similarly, data may be output to other systems for display, stored in a database library 715 on the system disk 714, or stored on computer-readable media in a digital format.

Alternatively, CPU 702 provides display processor 712 with data and/or instructions defining the desired output images, from which display processor 712 generates the pixel data of one or more output images, including characterizing and/or adjusting the offset between stereo image pairs. The data and/or instructions defining the desired output images can be stored in system memory 704 or graphics memory within display processor 712. CPU 702 and/or display processor 712 can employ any mathematical, function or technique known in the art to create one or more results from the provided data and instructions, including running models and comparing data from sensors to track the service life of chamber components.

It will be appreciated that the system shown herein is illustrative and that variations and modifications are possible. The connection topology, including the number and arrangement of bridges, may be modified as desired. For instance, in some embodiments, system memory 704 is connected to CPU 702 directly rather than through a bridge, and other devices communicate with system memory 704 via memory bridge 705 and CPU 702. In other alternative topologies display processor 712 is connected to I/O bridge 707 or directly to CPU 702, rather than to memory bridge 705. In still other embodiments, I/O bridge 707 and memory bridge 705 might be integrated into a single chip. The particular components shown herein are optional; for instance, any number of add-in cards or peripheral devices might be supported. In some embodiments, the process equipment 770 may be connected directly to the I/O bridge 707. In some embodiments, the switch 716 is eliminated, and the network adapter 718 and the add-in cards 720, 721 connect directly to the I/O bridge 707.

Various embodiments of the invention may be implemented as a program product for use with a computer system. The software routines of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

Any combination of one or more computer readable medium(s) may be utilized for storing a program product which, when executed, is configured to perform method for determining the service life of a chamber components. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, radio, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as JAVA™, SMALLTALK™, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer program instructions may also be loaded onto a computer, other programmable data processing apparatus, or other devices to cause a series of operations to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Embodiments of the invention may be provided to end users through a cloud computing infrastructure. Cloud computing refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Advantageously, the techniques presented herein allow for intelligent predictions of substrate quality based on manufacturing data, and allow for efficient decisions to be made regarding corrective actions to be taken with respect to individual substrates and other aspects of the manufacturing process. Use of embodiments of the present disclosure may reduce costs, improve efficiency, and allow for better strategic planning with respect to the manufacturing process.

As will be appreciated by one of ordinary skill in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may be referred to herein as a "circuit," "module" or "system." Furthermore, aspects of the present invention may take the form of a computer program product embodied in one or more computer readable medium(s) having computer readable program code embodied thereon. The controller 182 may computer or other suitable device for controlling the processing system 200. Aspects of the invention may run on the controller 282 or external device attached to the controller 282.

In the preceding, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples a computer readable storage medium include: an electrical connection having one or more wires, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the current context, a computer readable storage medium may be any tangible medium that can contain, or store a program.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to embodiments of the present disclosure, other and further embodiments of the disclosure may be devised without departing from the basic scope thereof, and the scope thereof is determined by the claims that follow.

What is claimed is:

1. A method for detecting a design-impacting defect in an integrated circuit substrate, comprising:
   determining a distribution of intended geometric features in a design window of the integrated circuit substrate based on proximities of a plurality of points of interest in the design window to the intended geometric features;
   obtaining a set of intended contours from the distribution;
   obtaining a set of imaged contours from one or more images of the integrated circuit substrate;
   comparing the set of imaged contours to the set of intended contours to obtain a set of potential design-impacting defects in the intended geometric features;
   determining a probability that a potential design-impacting defect from the set of potential design-impacting defects is a valid design-impacting defect, comprising one or more of:
      predicting that the potential design impacting defect exceeds a predetermined size; and
      predicting that the potential design impacting defect has a predetermined shape; and
   taking a corrective action based on the determined probability.

2. The method of claim 1, wherein the potential design-impacting defect represent a set of deviations from an intended geometric feature.

3. The method of claim 1, wherein a potential design-impacting defect is an open circuit in a design feature or a short circuit between design features.

4. The method of claim 1, wherein the determined probability is a probability of an open circuit in a design feature or a short circuit between design features.

5. The method of claim 1, wherein determining a proximity of a point of interest in the design window to an intended geometric feature comprises determining a Euclidian distance between the point and the intended design feature.

6. The method of claim 1, further comprising, before determining a distribution, dividing the substrate into a plurality of geometric areas comprising a corresponding plurality of design windows.

7. The method of claim 1, wherein the probability of the potential design-impacting defect is a valid design-impacting defect is used as a metric for predicting one or more design excursions.

8. The method of claim 1, wherein the corrective action is to alter a manufacturing process recipe or editing the integrated circuit substrate design.

9. The method of claim 1, further comprising transmitting a notification of the valid design-impacting defect to a display that displays a dashboard of valid design-impacting defects and their associated probabilities.

10. The method of claim 9, further comprising:
    rank ordering valid design-impacting defects and presenting the rank ordering on the dashboard.

11. The method of claim 10, further comprising:
    receiving a selection of one of the rank ordered valid design-impacting defects.

12. The method of claim 11, further comprising:
    identifying one or more steps in a recipe, a particular chamber, and a tool associated with the selected design-impacting defect in which the selected design-impacting defect was generated.

13. The method of claim 8, further comprising:
    determining, based on the selected valid design-impacting defects, its associated probability, and associated metrology data, predictive information about a quality of the substrate; and
    providing the predictive information to a manufacturing system, wherein the predictive information is used to determine whether to take the corrective action to remove the selected design-impacting defect.

14. A computing system, comprising:
    a memory; and
    a processor configured to perform a method for detecting a design-impacting defect in an integrated circuit substrate, the method comprising:
    determining a distribution of intended geometric features in a design window of the integrated circuit substrate based on proximities of a plurality of points of interest in the design window to the intended geometric features;
    obtaining a set of intended contours from the distribution;
    obtaining a set of imaged contours from one or more images of the integrated circuit substrate;
    comparing the set of imaged contours to the set of intended contours to obtain a set of potential design-impacting defects in the intended geometric features;
    determining a probability that a potential design-impacting defect from the set of potential design-impacting defects is a valid design-impacting defect, comprising one or more of:
       predicting that the potential design impacting defect exceeds a predetermined size; and
       predicting that the potential design impacting defect has a predetermined shape; and
    taking a corrective action based on the determined probability.

15. The computing system of claim 14, wherein the potential design-impacting defect represent a set of deviations from an intended geometric feature.

16. The computing system of claim 14, wherein a potential design-impacting defect is an open circuit in a design feature or a short circuit between design features.

17. A non-transitory computer-readable medium comprising instructions that when executed by a computing device cause the computing device to perform a method for detecting a design-impacting defect in an integrated circuit substrate, the method comprising:
- determining a distribution of intended geometric features in a design window of the integrated circuit substrate based on proximities of a plurality of points of interest in the design window to the intended geometric features;
- obtaining a set of intended contours from the distribution;
- obtaining a set of imaged contours from one or more images of the integrated circuit substrate;
- comparing the set of imaged contours to the set of intended contours to obtain a set of potential design-impacting defects in the intended geometric features;
- determining a probability that a potential design-impacting defect from the set of potential design-impacting defects is a valid design-impacting defect, comprising one or more of:
- predicting that the potential design impacting defect exceeds a predetermined size; and
- predicting that the potential design impacting defect has a predetermined shape; and
- taking a corrective action based on the determined probability.

18. The non-transitory computer-readable medium of claim 17, wherein the potential design-impacting defect represent a set of deviations from an intended geometric feature.

19. The non-transitory computer-readable medium of claim 17, wherein a potential design-impacting defect is an open circuit in a design feature or a short circuit between design features.

\* \* \* \* \*